(12) United States Patent
Qian et al.

(10) Patent No.: US 12,159,840 B2
(45) Date of Patent: Dec. 3, 2024

(54) SCALABLE AND INTEROPERABLE PHYLESS DIE-TO-DIE IO SOLUTION

(71) Applicant: Intel Corporation, Santa Clara, CA (US)

(72) Inventors: Zhiguo Qian, Chandler, AZ (US); Gerald Pasdast, San Jose, CA (US); Juan Zeng, San Jose, CA (US); Peipei Wang, San Jose, CA (US); Ahmad Siddiqui, Sunnyvale, CA (US); Lakshmipriya Seshan, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 881 days.

(21) Appl. No.: 16/910,023

(22) Filed: Jun. 23, 2020

(65) Prior Publication Data

US 2021/0398906 A1    Dec. 23, 2021

(51) Int. Cl.
*H01L 23/495* (2006.01)
*H01L 23/00* (2006.01)
*H01L 23/538* (2006.01)

(52) U.S. Cl.
CPC ...... *H01L 23/5386* (2013.01); *H01L 23/5381* (2013.01); *H01L 24/16* (2013.01); *H01L 2224/16227* (2013.01)

(58) Field of Classification Search
CPC ............. H01L 23/5386; H01L 23/5381; H01L 21/563; H01L 2224/16145; H01L 23/49816; H01L 25/0657; H01L 2224/0401; H01L 2924/15311; H01L 2225/1058; H01L 2224/81801; H01L 25/0652; H01L 2224/04042; H01L 24/06; H01L 2224/12105; H01L 2924/18161;
(Continued)

(56) References Cited

U.S. PATENT DOCUMENTS 6,992,896 B2   1/2006 Fraley
9,589,092 B2 * 3/2017 Fang ................ G06F 30/392
(Continued)

FOREIGN PATENT DOCUMENTS

JP      2011139083       7/2011
WO   WO-2016118210 A2 * 7/2016  ......... H01L 23/3736

OTHER PUBLICATIONS

Office Action for Japan Patent Application No. 2020-199448 mailed Jul. 9, 2024, 3 pages.

*Primary Examiner* — Niki H Nguyen
(74) *Attorney, Agent, or Firm* — Schwabe, Williamson & Wyatt P.C.

(57) ABSTRACT

Embodiments disclosed herein include multi-die packages with interconnects between the dies. In an embodiment, an electronic package comprises a package substrate, and a first die over the package substrate. In an embodiment, the first die comprises a first IO bump map, where bumps of the first IO bump map have a first pitch. In an embodiment, the electronic package further comprises a second die over the package substrate. In an embodiment, the second die comprises a second IO bump map, where bumps of the second IO bump map have a second pitch that is different than the first pitch. In an embodiment, the electronic package further comprises interconnects between the first IO bump map and the second IO bump map.

27 Claims, 14 Drawing Sheets

(58) Field of Classification Search
CPC . H01L 2924/15331; H01L 2225/06513; H01L 2225/06517; H01L 2224/16227; H01L 2224/04105; H01L 2224/1403; H01L 23/12; H01L 2924/207; H01L 2924/19105; H01L 2224/16237; H01L 2224/73104; H01L 2224/13025; H01L 2224/81192

See application file for complete search history.

(56) References Cited

U.S. PATENT DOCUMENTS

| | | | |
|---|---|---|---|
| 10,535,608 B1* | 1/2020 | Rubin | H01L 24/73 |
| 2014/0264836 A1 | 9/2014 | Chun | |
| 2016/0161992 A1* | 6/2016 | Kwon | H01L 23/49811 361/767 |
| 2018/0005945 A1* | 1/2018 | Pietambaram | H01L 24/11 |
| 2018/0033753 A1* | 2/2018 | Camarota | H01L 23/49827 |
| 2018/0102470 A1* | 4/2018 | Das | H01L 23/5384 |
| 2018/0181524 A1* | 6/2018 | Schulz | G06F 13/385 |
| 2019/0304912 A1* | 10/2019 | Ecton | H01L 23/5386 |
| 2020/0343612 A1* | 10/2020 | Shi | H01L 23/66 |

* cited by examiner

SCALABLE AND INTEROPERABLE PHYLESS DIE-TO-DIE IO SOLUTION

TECHNICAL FIELD

Embodiments of the present disclosure relate to semiconductor devices, and more particularly to electronic packages with a PHYless die-to-die IO interconnect.

BACKGROUND

In order to provide enhanced functionality, improved performance, and improved yield at advanced processing nodes, die disaggregation into multiple chiplets has been a growing trend in the semiconductor manufacturing industry. Die disaggregation requires that the individual chiplets be able to communicate with each other through input/output (IO) bumps. Depending on the needed interconnect density and bump pitches, channels may be implemented with different architectures. For example C4 bumps may utilize channels in a standard package substrate. At more advanced technology nodes, microbumps may be used in conjunction with channels that are implemented in an embedded bridge die.

Currently, the IOs are designed with a physical layer (PHY). This process results in hard IP (HIP) needing to be custom designed for each IO field. As such, there is significant circuit design effort and silicon risk associated with the design of different chiplets. The need for custom HIP in PHY-based designs also limits the portability needed for easy scaling to support different packaging technologies. Additionally, there is a lack of interoperability between PHY-based designs that have different bump pitches.

EMBODIMENTS OF THE PRESENT DISCLOSURE

Described herein are electronic packages with a PHYless die-to-die IO interconnect, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, die disaggregation creates the challenge of providing IO channels between chiplets. Currently, the IOs between chiplets are implemented using a dedicated hard IP (HIP) PHY. HIP PHYs require traditional levels of customization and hand design. This increases the cost of designing new chiplets, especially when scaling to more advanced processing nodes. Additionally, current PHY layers are not interoperable with each other. That is, a chiplet with an IO bump map with a first pitch is not easily coupled to a chiplet with an IO bump map with a second pitch.

Figure 1A:
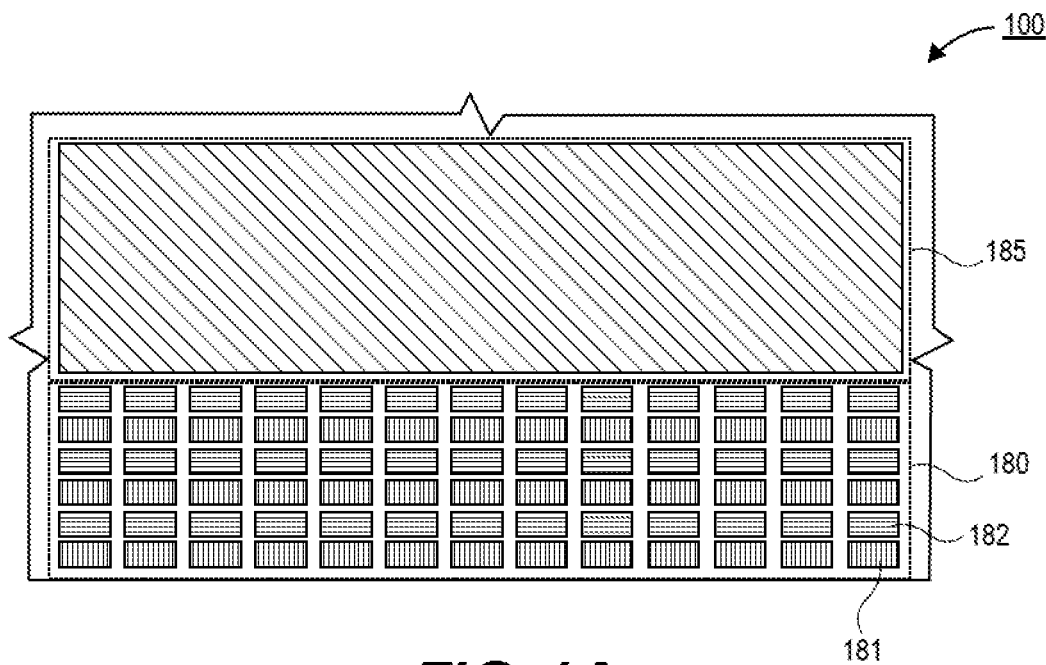
FIG. 1A is a plan view illustration of a portion of a die with IO implemented in a PHY layer.

An example of a PHY-based IO bump region is shown in FIG. 1A. FIG. 1A is a macro view of an IO region 180 and a logic region 185 of a die 100. The view shown in FIG. 1A is after the removal of the bumps. As shown, the IO region 180 includes a regular repeating pattern of blocks 181/182.

The regular repeating pattern is indicative of the bump region being designed manually. In contrast, the logic region 185 is seen as a monolithic structure that is indicative of the logic and routing being designed with the use of an automatic place and route tool.

Accordingly, embodiments disclosed herein include the use of PHYless IO bump map and circuit/floorplan arrangements. In an embodiment, interoperability is provided by maintaining the width of an IO bump map along the edge of the die (i.e., the shoreline width) uniform between IO bump maps with various bump pitches. While keeping the same shoreline width, the depth into the die of a given IO bump map may be variable. In this manner, a consistent number of signaling bumps may be provided for IO bump maps with different bump pitches.

Additionally, PHYless designs eliminate the need for custom HIP for each device. For example, the IO circuit of a chiplet may be mainly composed of digital cells from a standard library. These cells may be easily taped out with the digital design flow, in order to minimize the circuit design efforts and silicon risks.

Figure 1B:
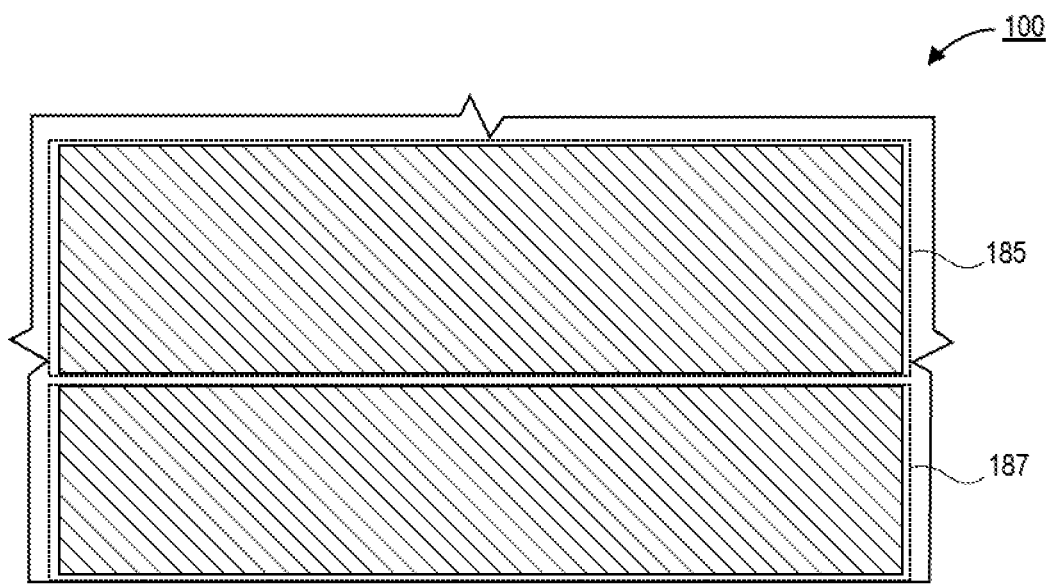
FIG. 1B is a plan view illustration of a portion of a die with IO implemented in a PHYless layer, in accordance with an embodiment.

An example of a PHYless IO bump region 187 is shown in FIG. 1B. FIG. 1B is a macro view of an IO region 187 and a logic region 185 of a die 100. The view shown in FIG. 1B is after the removal of the bumps. As shown, there is no discernable repeating pattern in the IO region 187. This is indicative of the IO region 187 being designed with an automatic place and route tool.

Figure 2A:
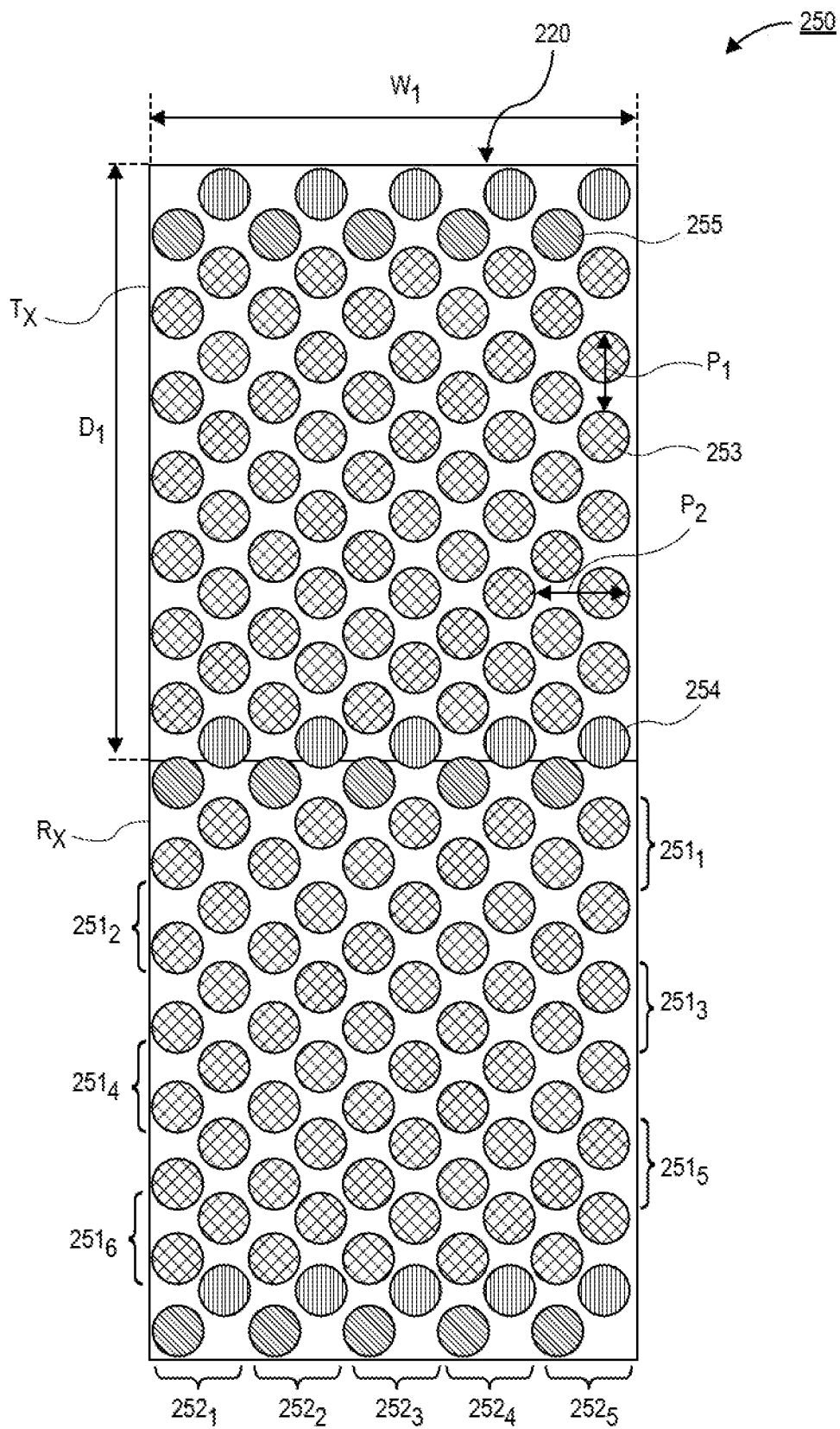
FIG. 2A is a plan view illustration of an IO bump map for a transmitter region and a receiver region with a first bump pitch, in accordance with an embodiment.

Referring now to FIG. 2A, a plan view illustration of an IO bump map 250 is shown, in accordance with an embodiment. In the illustrated embodiment, a transmitter region $T_X$ and a receiver region $R_X$ are provided. The transmitter region $T_X$ is positioned along the die edge 220 and the receiver region $R_X$ is stacked behind (i.e., below in FIG. 2A) the transmitter region $T_X$. In an embodiment, the IO bump map 250 may comprise signaling bumps 253, power bumps 254, and ground bumps 255. The bumps 253, 254, 255 may be arranged in a hexagon pattern. However, other bump layout patterns may also be used in different embodiments.

In an embodiment, the bumps 253, 254, 255 may have a pitch $P_1$. The pitch $P_1$ is measured in a direction perpendicular to the die edge 220. The bumps 253, 254, 255 may also have a pitch $P_2$ that is measured in the direction parallel to the die edge 220. The pitch $P_1$ and the pitch $P_2$ may be different in some embodiments. In other embodiments, the pitch $P_1$ and the pitch $P_2$ may be substantially similar to each other. In an embodiment, the pitch $P_1$ may be 55 μm and the pitch $P_2$ may be 98 μm.

In an embodiment, the transmitter region $T_X$ and the receiver region $R_X$ comprise columns 252 and rows 251. As shown, in the embodiment of FIG. 2A, each row comprises ten signaling bumps 253 and each column comprises twelve signaling bumps 253. There are five columns $252_{1-5}$ and six rows $251_{1-6}$ to provide a total of sixty signaling bumps 253. However, it is to be appreciated that sixty signaling bumps 253 is exemplary in nature, and that scaling efforts such as those disclosed herein may set any number of signaling bumps 253 in the bump map 250 (and any number of signaling bumps 253 in each of the rows 251 and/or columns 252).

In an embodiment, the bump map 250 may have a shoreline width $W_1$ along the die edge 220. In an embodiment, the transmitter region $T_X$ may have a depth $D_1$ into the die. The receiver region $R_X$ may also have the same depth $D_1$. The first pitch $P_1$ provides a depth $D_1$ of 412.5 μm, and the second pitch $P_2$ provides a shoreline width $W_1$ that is approximately 490 μm. In an embodiment, a ratio of signaling bumps 253 to power bumps 254 and ground bumps 255 is 4:1.

Figure 2B:
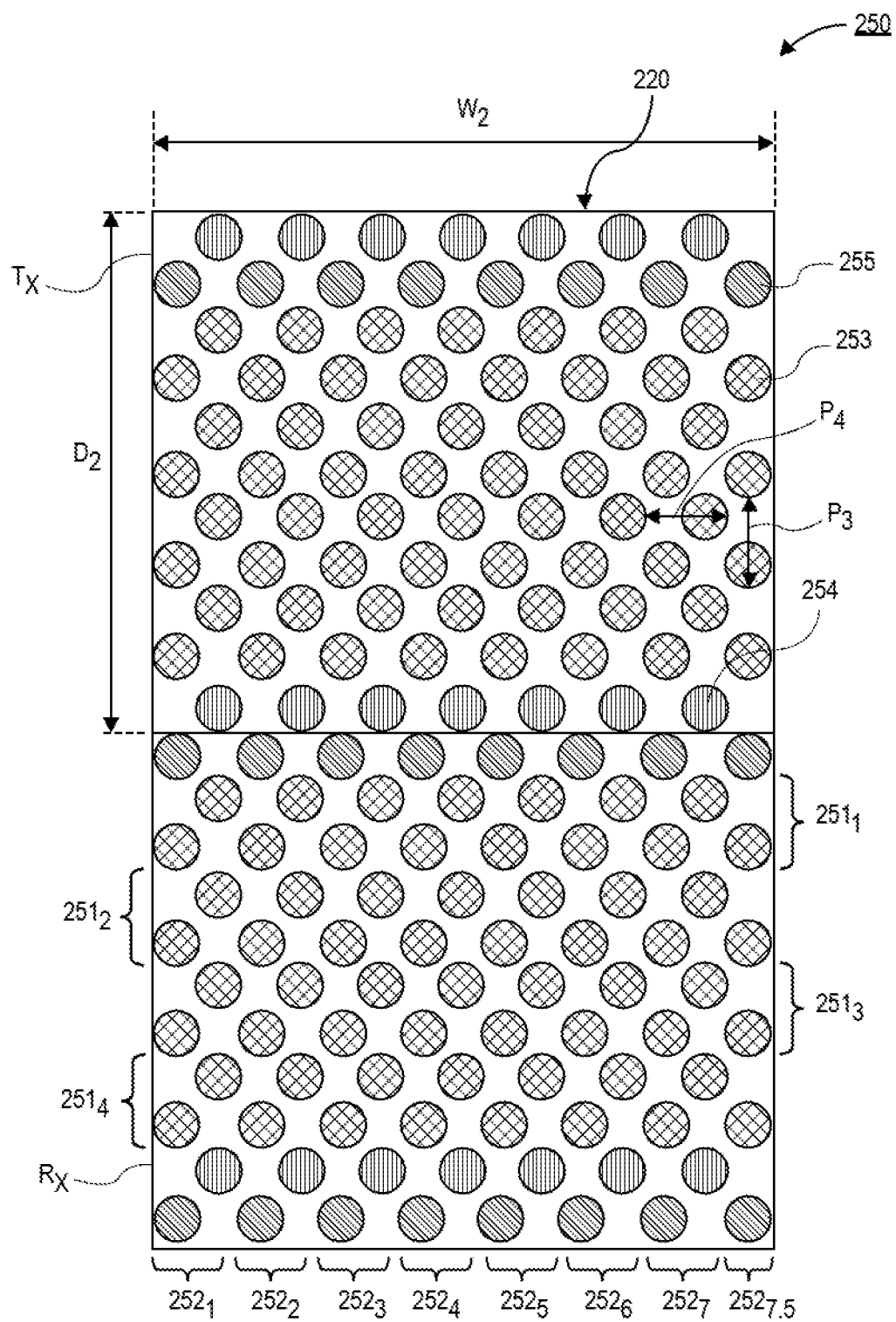
FIG. 2B is a plan view illustration of an IO bump map for a transmitter region and a receiver region with a second bump pitch, in accordance with an embodiment.

As will be shown in FIGS. 2B, interoperability between the bump maps 250 with different pitches are provided by maintaining a consistent number of signaling bumps 253 and a uniform shoreline width $W_1$. Referring now to FIG. 2B, a plan view illustration of a bump map 250 is shown in accordance with an additional embodiment. In an embodiment, the bump map 250 of FIG. 2B may have a third pitch $P_3$ and a fourth pitch $P_4$. The third pitch $P_3$ is measured perpendicular to the die edge 220, and the fourth pitch $P_4$ is measured parallel to the die edge 220. In an embodiment, the third pitch $P_3$ may be smaller than the first pitch $P_1$, and the fourth pitch $P_4$ may be smaller than the second pitch $P_2$. For example, where the first pitch $P_1$ is 55 μm, the third pitch $P_3$ may be 36 μm, and where the second pitch $P_2$ is 98 μm, the fourth pitch $P_4$ may be 65.3 μm.

However, the number of signaling bumps 253 in FIG. 2B and the shoreline width $W_2$ in FIG. 2B are equal to the number of signaling bumps 253 in FIG. 2A and the shoreline width $W_1$ in FIG. 2A. The consistent number of signaling bumps 253 and the uniform shoreline width W is enabled by increasing the number of columns 252 and reducing the number of rows 251 in the bump map 250 of FIG. 2B. For example, the bump map 250 in FIG. 2B may comprise 7.5 columns $252_{1-7.5}$ and four rows $251_{1-4}$. By reducing the number of rows 251, the depth $D_2$ of the bump map 250 in FIG. 2B is reduced compared to the bump map 250 in FIG. 2A.

While FIG. 2A shows a minimum bump pitch of 55 μm and FIG. 2B shows a minimum bump pitch of 36 μm, it is to be appreciated that scaling to different bump pitches is also possible while maintaining a uniform shoreline width and number of signaling bumps 253. For example, minimum bump pitches of 45 μm and 25 μm may also have bump maps 250 that are interoperable with each other. A 45 μm minimum bump pitch may have six columns 252 and five rows 253, and a 25 μm minimum bump pitch may have ten columns and three rows 253. It is to be appreciated that minimum bump pitches that are greater than 55 μm and that are smaller than 25 μm may also be provided while maintaining the uniform shoreline width and number of signaling bumps.

Figure 2C:
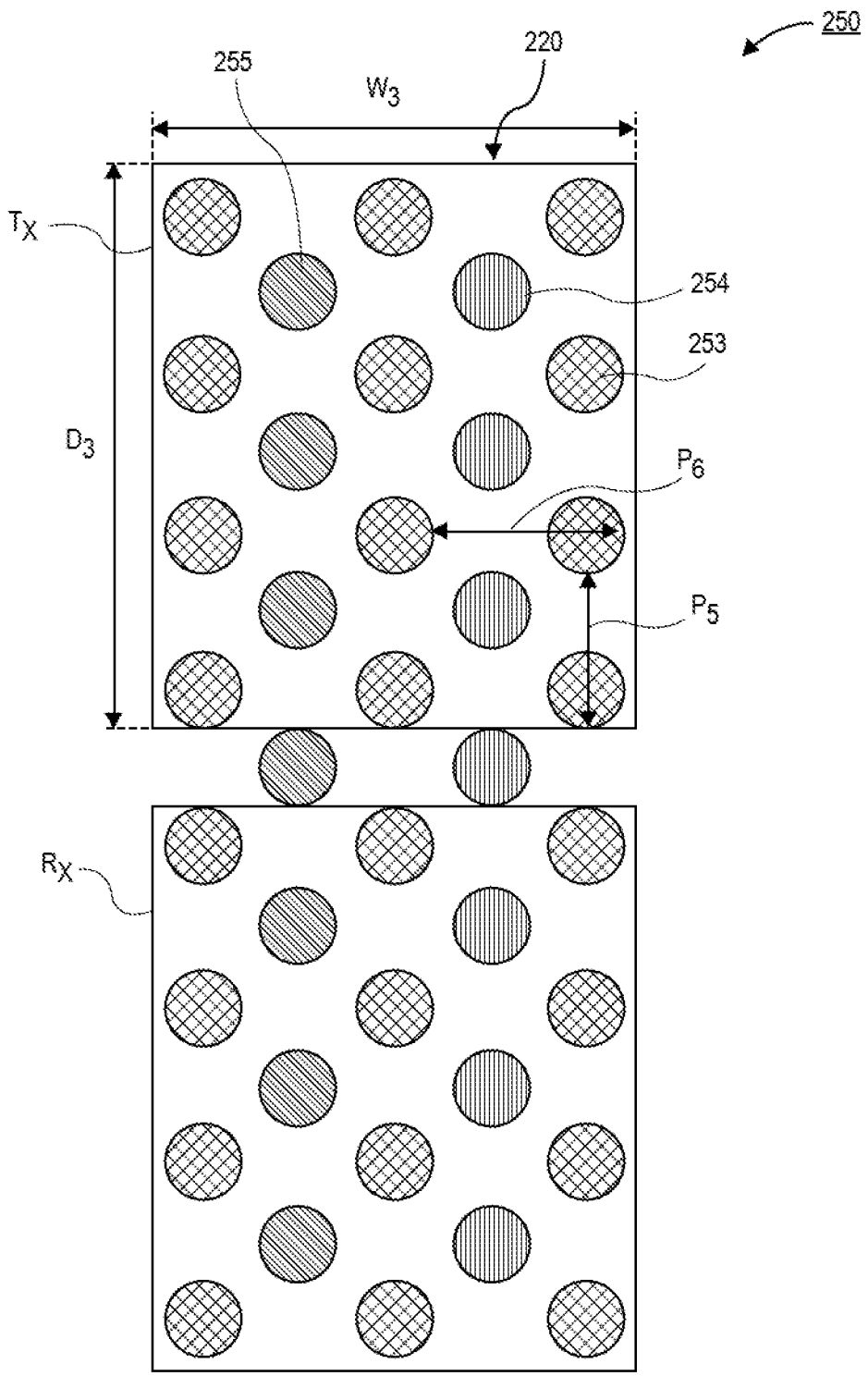
FIG. 2C is a plan view illustration of an IO bump map for a transmitter region and a receiver region with a third bump pitch, in accordance with an embodiment.
Figure 3A:
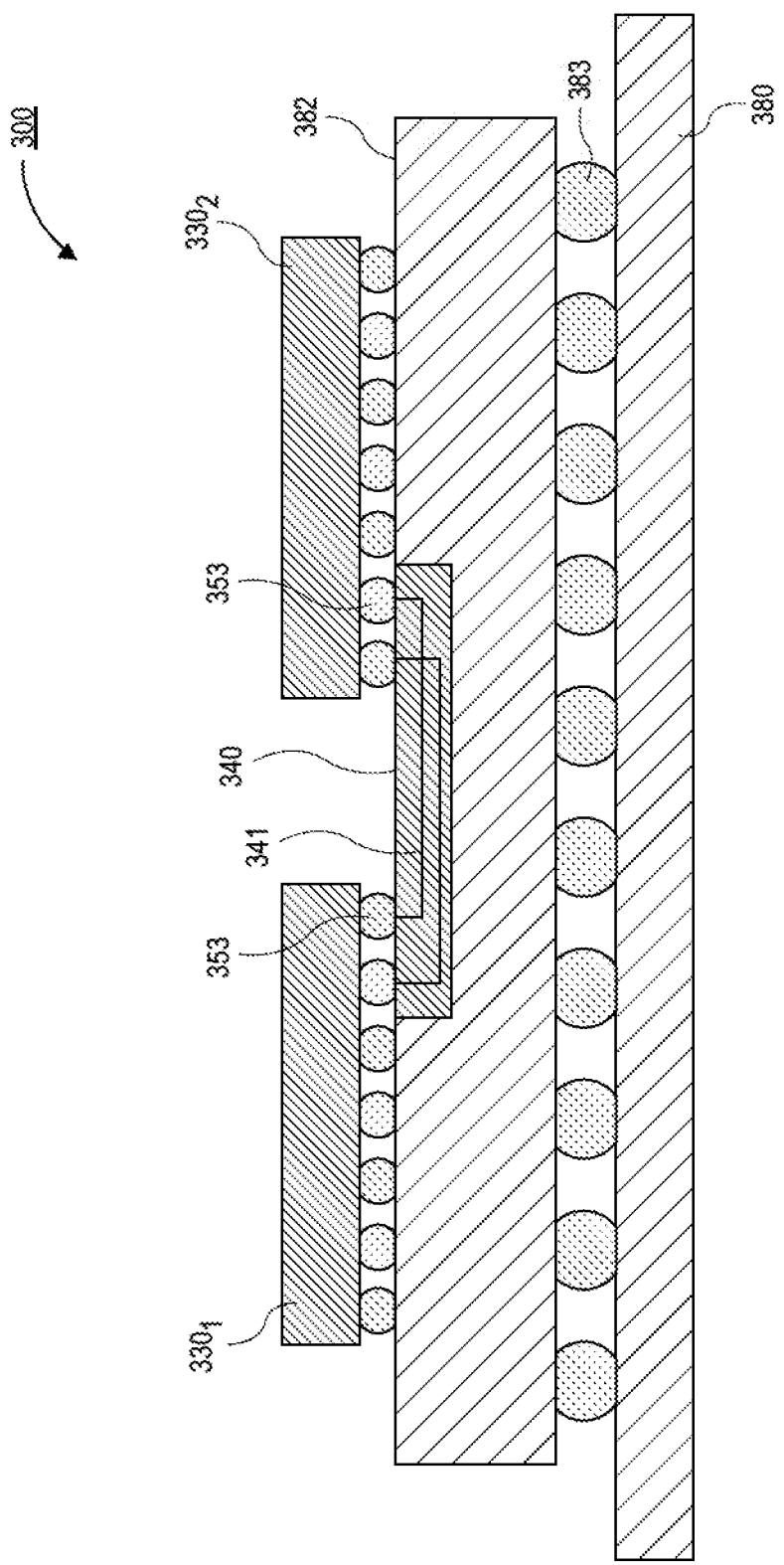
FIG. 3A is a cross-sectional illustration of an electronic package with dies that are communicatively coupled across a bridge in the electronic package, in accordance with an embodiment.

Interoperable bump maps 250 may also be provided for traditional C4 bumps. Such an embodiment is shown in FIG. 2C. In an embodiment, C4 signaling bumps 253 may have a fifth pitch $P_5$ perpendicular to the die edge 220 that is approximately 110 μm and a sixth pitch $P_6$ parallel to the die edge 220 that is 196 μm. The larger bump pitches $P_5$ and $P_6$ reduce the number of signaling bumps 253 that can be included in the bump map 250. For example, twelve signaling bumps 253 are provided in each of the $T_X$ region and the $R_X$ region. However, the shoreline width $W_3$ may be matched to the shoreline width $W_1$ and/or $W_2$ of FIGS. 2A and 2B. That is, in some embodiments, the shoreline width $W_3$ may be 490 μm. In an embodiment, the depth D3 of each of the $T_X$ region and the $R_X$ region may be approximately 412.5 μm Referring now to FIG. 3A, a cross-sectional illustration of an electronic package 300 is shown, in accordance with an embodiment. In an embodiment, the electronic package 300 may comprise a package substrate 382 that is attached to a board 380 (e.g., a mother board) by interconnects 383. In an embodiment, the interconnects 383 are shown as solder balls. However, it is to be appreciated that the interconnects 383 may comprise any suitable interconnect architecture (e.g., sockets, etc.).

In an embodiment, the package substrate 382 comprises layers of insulative material surrounding conductive traces (not shown). In an embodiment, the package substrate 382 may be a cored substrate or coreless. In an embodiment, a bridge 340 is embedded in the package substrate 382. The bridge 340 may comprise a substrate material suitable for forming high density routing of channels 341 in order to communicatively couple a first die $330_1$ to a second die $330_2$. For example, the bridge 340 may comprise silicon with metal layers provided in a backend region.

In an embodiment, the first die $330_1$ and the second die $330_2$ may be any type of semiconductor devices. For example, the first die $330_1$ and the second die $330_2$ may be processors (e.g., CPU, GPU), memories, systems on chip (SoC), or the like. In some embodiments, the first die $330_1$ and the second die $330_2$ may be the same type of die. In other embodiments, the first die $330_1$ may be a different type of die than the second die $330_2$. In some embodiments, a minimum pitch of bumps 353 of the first die $330_1$ may be different than a minimum pitch of bumps 353 of the second die $330_2$. Despite the difference in bump pitch, the bump map of the first die $330_1$ may be interoperable with the bump map of the second die $330_2$.

Figure 3B:
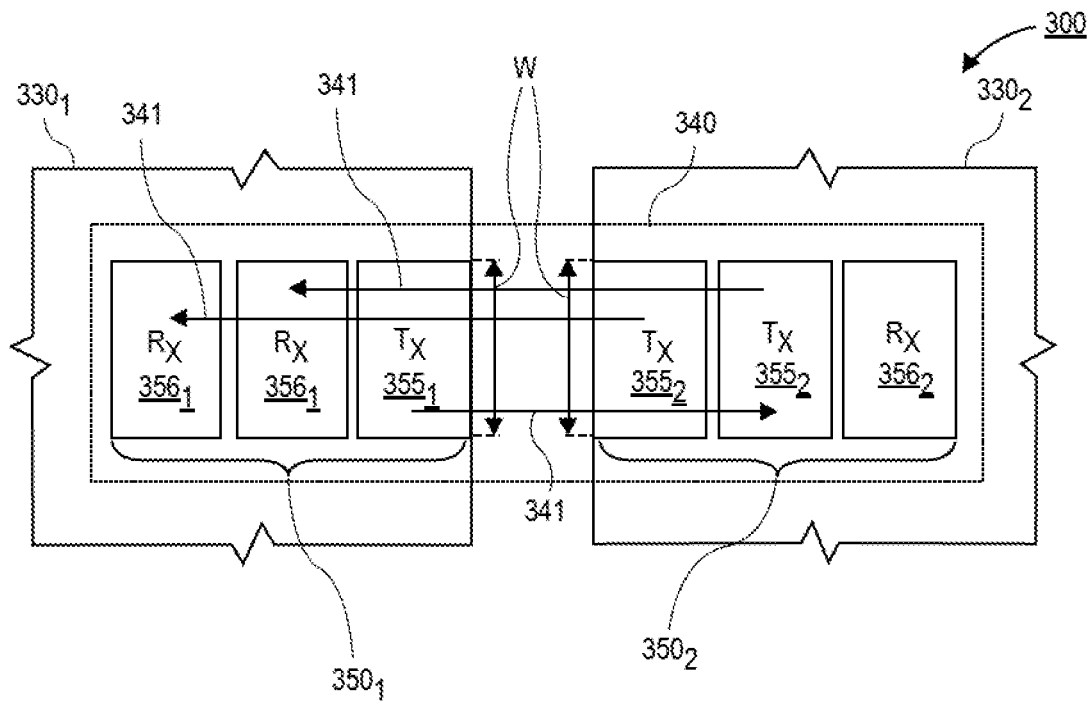
FIG. 3B is a schematic plan view illustration depicting the channels across the bridge between IO bump maps with the same bump pitch, in accordance with an embodiment.

Referring now to FIG. 3B, a plan view schematic of a first die $330_1$ that is communicatively coupled to a second die $330_2$ is shown, in accordance with an embodiment. The first die $330_1$ comprises a first bump map $350_1$ and the second die $330_2$ comprises a second bump map $350_2$. The first bump map $350_1$ comprises a $T_X$ region $355_1$ and a pair of $R_X$ regions $356_1$. The $T_X$ region $355_1$ is located proximate to an edge of the first die $330_1$. The second bump map $350_2$ comprises a pair of $T_X$ regions $355_2$ and an $R_X$ region $356_2$. One of the $T_X$ regions $355_2$ is located proximate to an edge of the second die $330_2$. Providing the $T_X$ regions 355 proximate to the die edges with the $R_X$ regions 356 deeper into the die 330 simplifies the design effort, since there is no need to create a different design with swapped $T_X$ and $R_X$ locations with respect to the die edge. As shown, the shoreline width W of the $T_X$ region $355_1$ and the $T_X$ region $355_2$ are equal to each other.

In the illustrated embodiment, three modules are stacked along the edge of each die (i.e., the $T_X$ region $355_1$ and the pair of $R_X$ regions $356_1$ in the first die $330_1$, and the pair of $T_X$ regions $355_2$ and the $R_X$ region $356_2$ in the second die $330_2$). However, it is to be appreciated that any number of modules (i.e., one or more) may be provided along the die edges. In order to provide additional bandwidth, additional modules may be laterally adjacent to the modules shown in FIG. 3B.

In an embodiment, the $T_X$ regions 355 are communicatively coupled to $R_X$ regions 356 on the opposite die 330 by channels 341 in the bridge 340. For example, $T_X$ region $355_1$ is communicatively coupled to $R_X$ region $356_2$ by a channel 341, and $T_X$ regions $355_2$ are each coupled to a different $R_X$ region $356_1$ by a channel 341.

Figure 3C:
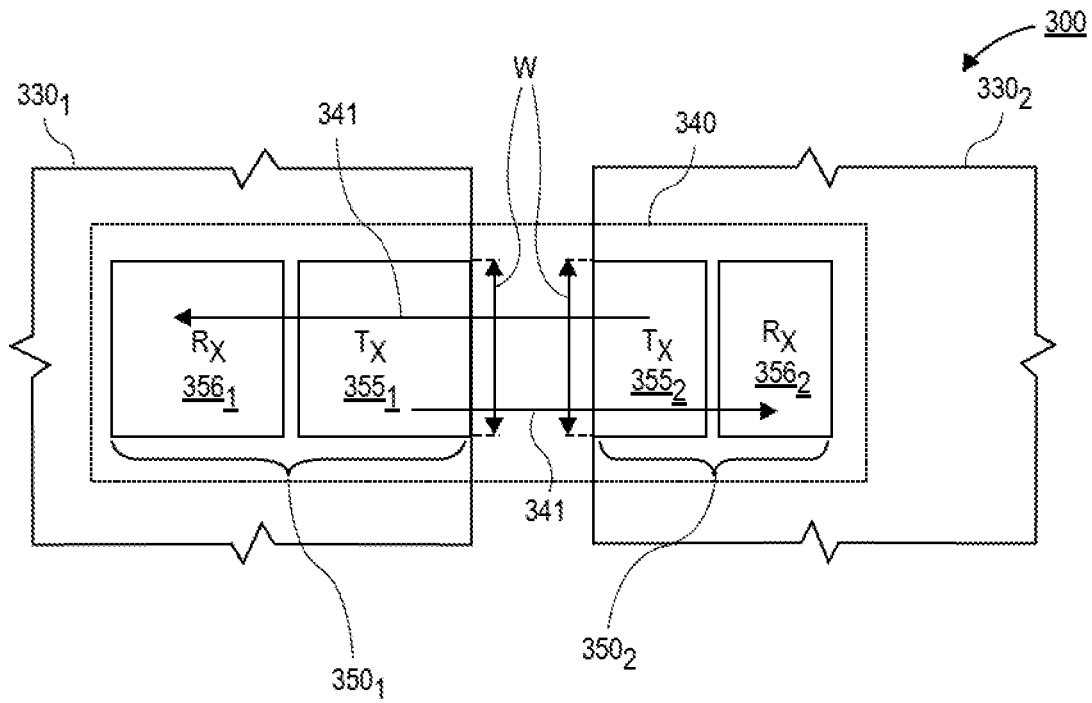
FIG. 3C is a schematic plan view illustration depicting the channels across the bridge between IO bump maps with different pitches, in accordance with an embodiment.

Referring now to FIG. 3C, a plan view schematic illustration of an electronic package 300 is shown, in accordance with an additional embodiment. In FIG. 3C, the first die $330_1$ includes a first bump map $350_1$ with a $T_X$ region $355_1$ and an $R_X$ region $356_1$ that have a first bump pitch, and the second die $330_2$ includes a second bump map $350_2$ with a $T_X$ region $355_2$ and an $R_X$ region $356_2$ that have a second bump pitch. Despite the difference in bump pitch, the first bump map $350_1$ and the second bump map $350_2$ include a uniform shoreline width W, and are therefore able to communicate with each other across the bridge 340. In FIG. 3C, the first $T_X$ region $355_1$ may be communicatively coupled to the second $R_X$ region $356_2$ by a channel 341 in the bridge 340, and the second $T_X$ region $355_2$ may be communicatively coupled to the first $R_X$ region $356_1$ by a channel 341 in the bridge 340.

In an embodiment, the first bump map $350_1$ may be similar to the bump map 250 in FIG. 2A, and the second bump map $350_2$ may be similar to the bump map 250 in FIG. 2B. That is, a minimum bump pitch in the first bump map $350_1$ may be 55 μm, and a minimum bump pitch in the second bump map $350_2$ may be 36 μm. However, it is to be appreciated that the minimum bump pitches of the first bump map $350_1$ and the second bump map $350_2$ may be any value, so long as the shoreline widths W remain the same.

Figure 3D:
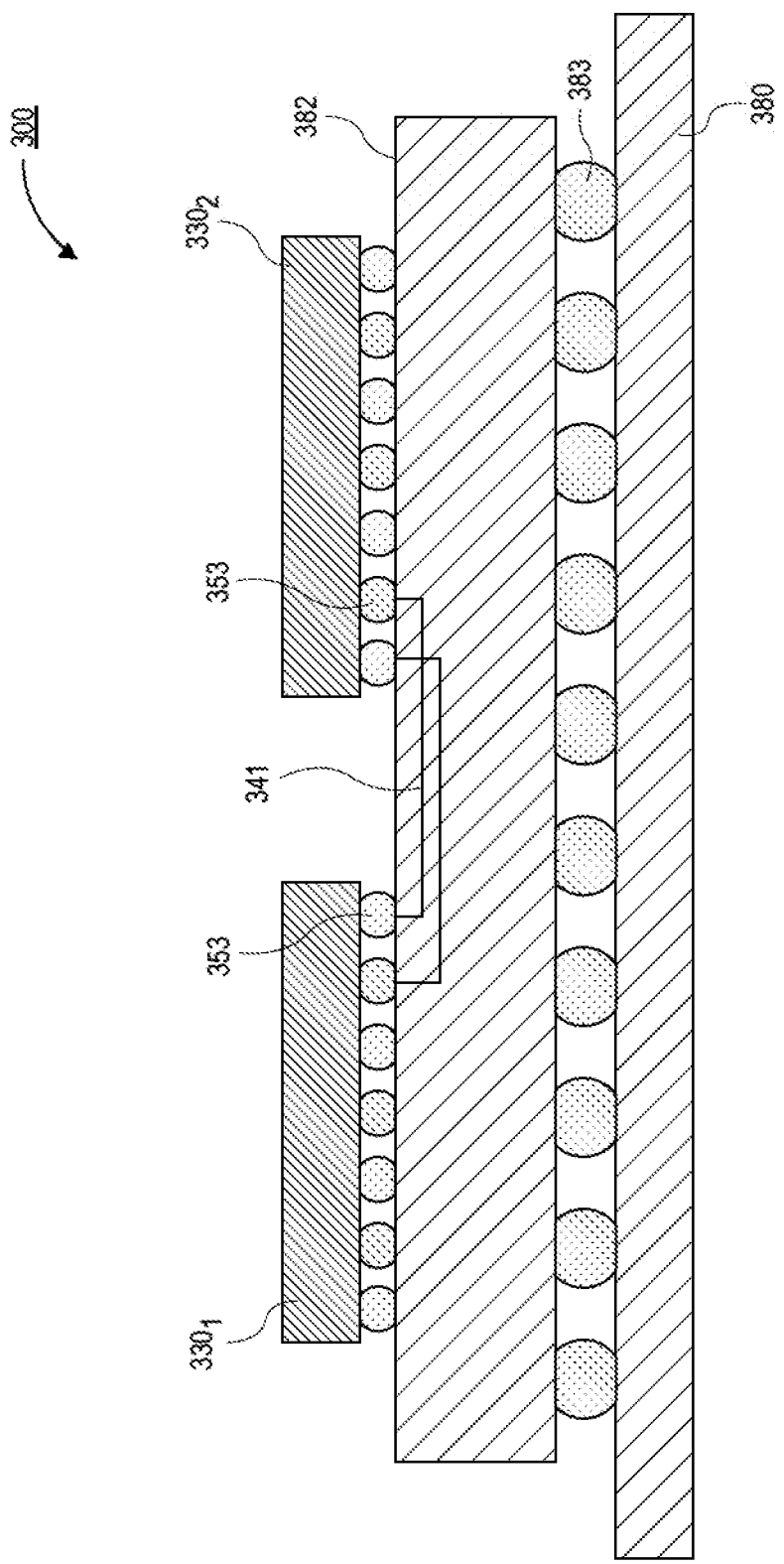
FIG. 3D is a cross-sectional illustration of an electronic package with dies that are communicatively coupled across a package substrate, in accordance with an embodiment.

Referring now to FIG. 3D, a cross-sectional illustration of an electronic package 300 is shown, in accordance with an additional embodiment. The electronic package 300 in FIG. 3D is similar to the electronic package 300 in FIG. 3A, with the exception that the bridge 340 is omitted. Instead, channels 341 are on (or embedded in) the package substrate. Such electronic packages 300 are suitable for dies 330 that have standard C4 bump pitches. That is, the minimum pitch of bumps 353 may be 110 μm.

Figure 3E:
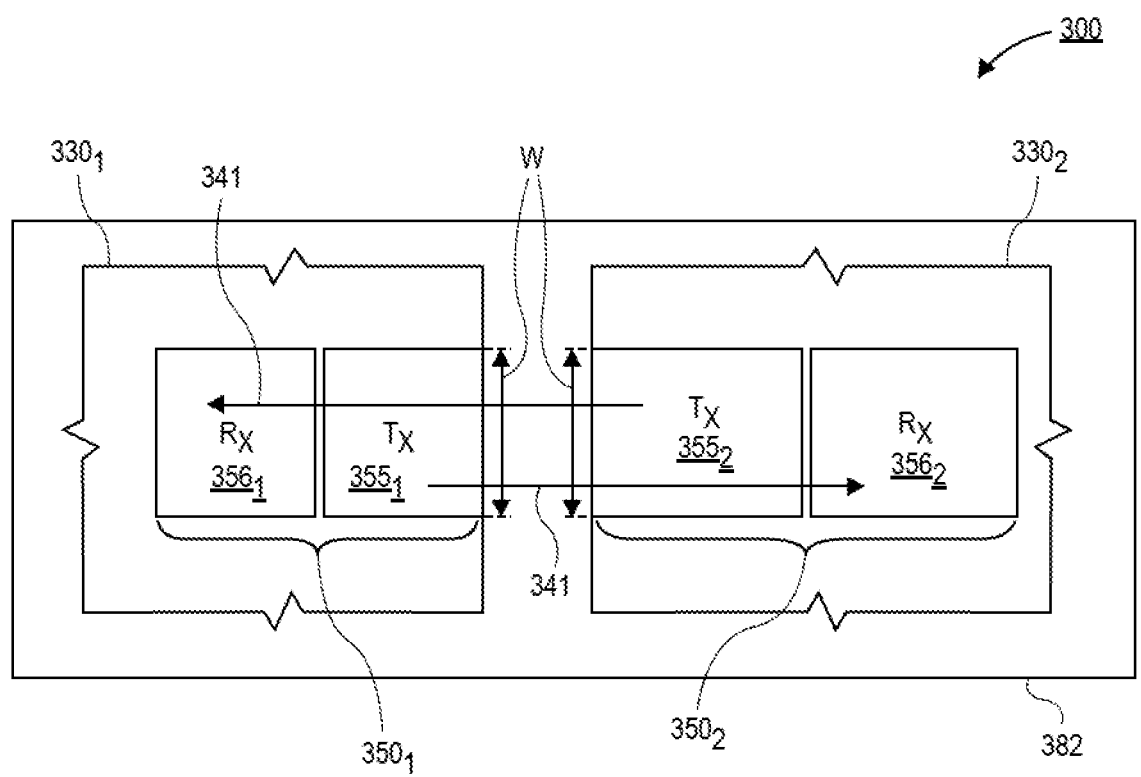
FIG. 3E is a schematic plan view illustration depicting the channels across the package substrate between IO bump maps with different pitches, in accordance with an embodiment.

Referring now to FIG. 3E, a plan view schematic illustration of the electronic package 300 in FIG. 3D is shown, in accordance with an embodiment. As shown, the module design of the $T_X$ and $R_X$ regions allows for circuit reuse across different package technologies. For example, the first die $330_1$ may comprise a first bump map $350_1$ with a $T_X$ region $355_1$ and an $R_X$ region $356_1$, and the second die $330_2$ may comprise a second bump map $350_2$ with a $T_X$ region $355_2$ and an $R_X$ region $356_2$. The second bump map $350_2$ may have a minimum bump pitch of 110 μm suitable for use with C4 bumps.

Due to the uniform shoreline width W, the first bump map $350_1$ is interoperable with the second bump map $350_2$. Since the bump maps $350_1$ and $350_2$ are compatible with each other, the first bump map $350_1$ just needs to increase its minimum bump pitch (e.g., from 55 μm to 110 μm). The module bump map design supports keeping twelve signals out of the total sixty signals for each module to connect with the second bump map $350_2$ (e.g., similar to the embodiment shown in FIG. 2C). As such, the only change to the first bump map $350_1$ is the simple change in the far back-end layer and the bumps. That is, the underlying circuitry may remain the same whether a 55 μm bump pitch or a 110 μm bump pitch is used.

Figure 4A:
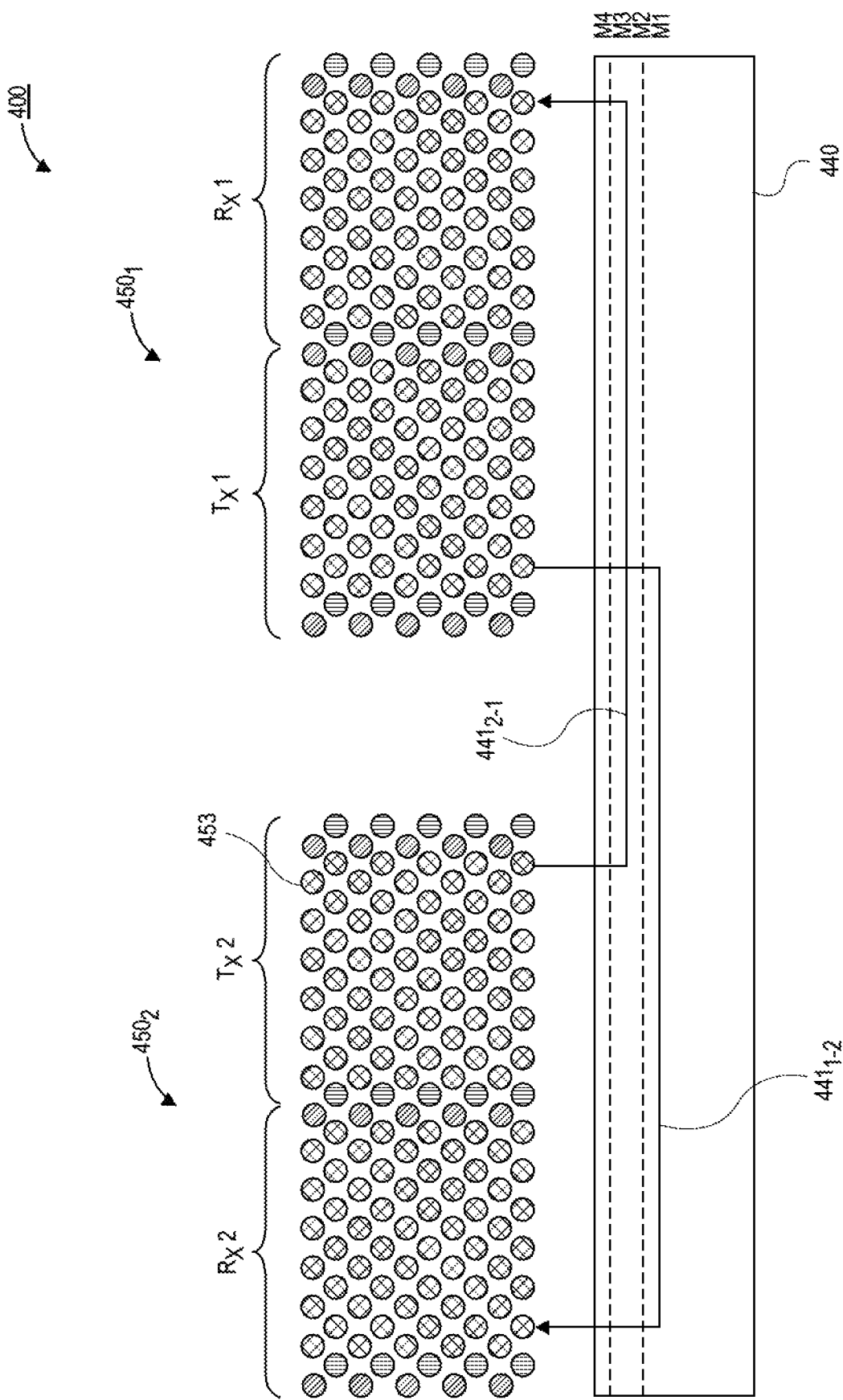
FIG. 4A is a plan view of a pair of bump maps and a cross-sectional illustration of the bridge that provides channels between the bump maps, in accordance with an embodiment.

Referring now to FIG. 4A, a composite plan view and cross-sectional illustration of an electronic package 400 is shown, in accordance with an embodiment. In FIG. 4A, a first bump map $450_1$ and a second bump map $450_2$ are provided as a plan view and the underlying bridge 440 is shown as a cross-sectional view. The first bump map $450_1$ and the second bump map $450_2$ may each comprise a $T_X$ region and an $R_X$ region. The $T_X$ regions (i.e., $T_X1$ and $T_X2$) are located along die edges, and the $R_X$ regions (i.e., $R_X1$ and $R_X2$) are stacked into the die.

In the cross-sectional portion of FIG. 4A, a bridge 440 with a plurality of metal layers M1-M4 is shown. A pair of channels 441 are illustrated in the bridge 440. A first channel $441_{1-2}$ between bumps 453 in $T_X1$ and $R_X2$ is disposed in the first metal layer M1, and a second channel $441_{2-1}$ between bumps 453 in $T_X2$ and $R_X1$ is disposed in the third metal layer M3. In an embodiment, the intra-module channels 441 are length matched to minimize the skew between all data lanes and the clock. The inter-module channels are also matched. In the illustrated matched design, the channel $441_{2\text{-}1}$ needs to route through the $T_X1$ signal via landings in the M3 layer. However, the high density routing design rules of bridge architectures allows for the such routing to be easily realized.

Figure 4B:
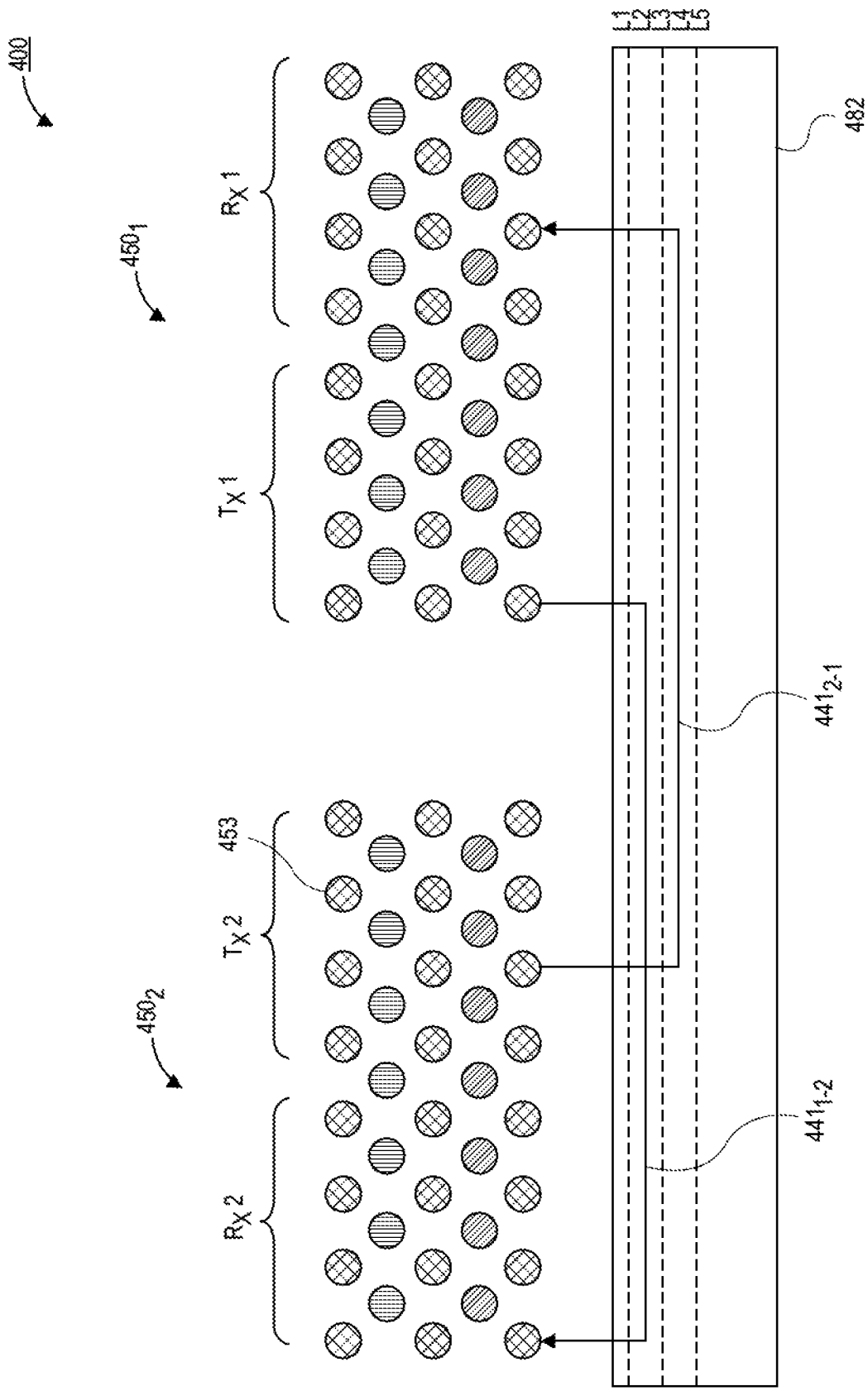
FIG. 4B is a plan view of a pair of bump maps and a cross-sectional illustration of the package substrate that provides channels between the bump maps, in accordance with an embodiment.

Referring now to FIG. 4B, a composite plan view and cross-sectional illustration of an electronic package 400 is shown, in accordance with an additional embodiment. In FIG. 4B, a first bump map $450_1$ and a second bump map $450_2$ are provided as a plan view and the underlying package substrate 482 is shown as a cross-sectional view. The first bump map $450_1$ and the second bump map $450_2$ are shown as being suitable for C4 bumps (e.g., having a minimum bump pitch of 110 μm). As such, the channels 441 are able to be implemented using channels 441 in a standard packaging substrate 482 without the need for a bridge.

The packaging substrate 482 may comprise a plurality of metal layers. For example 5 metal layers L1-L5 are shown. The channel $441_{1\text{-}2}$ is provided in the second metal layer L2 and the channel $441_{2\text{-}1}$ is provided in the fourth metal layer L4. The channels $441_{1\text{-}2}$ and $441_{2\text{-}1}$ are inter-module and intra-module matched, similar to the embodiment above in FIG. 4A. However, the design rules for a traditional packaging substrate 482 does not allow for simple routing. One solution may be swapping the $T_X2$ and $R_X2$ locations so that the channel $441_{2\text{-}1}$ is longer than the channel $441_{1\text{-}2}$ and does not include any cross-over. However, such a solution would require two different module placements and silicon designs, and would restrict the interoperability provided by embodiments disclosed herein.

Figure 4C:
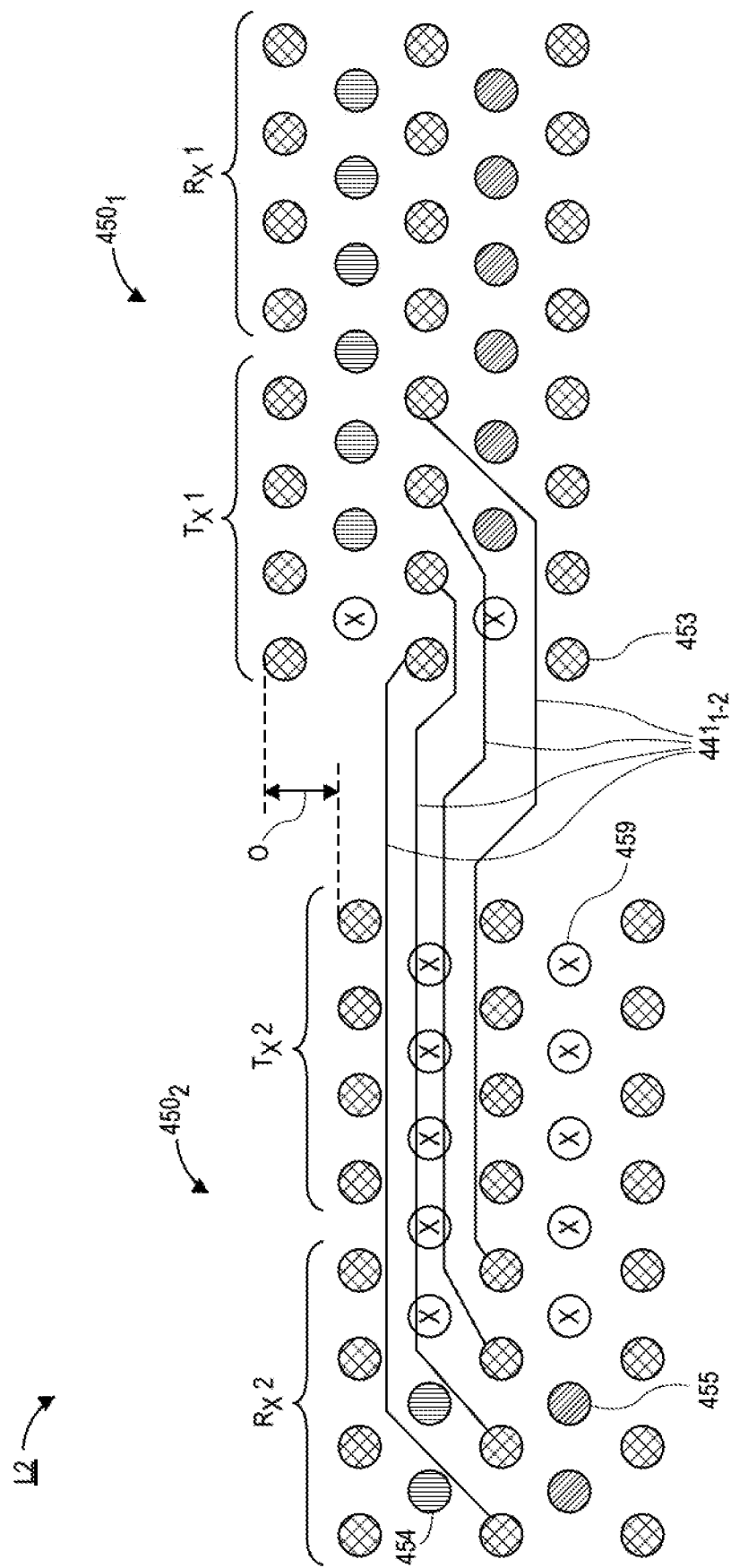
FIG. 4C is a plan view illustration of routing within a layer of the package substrate in FIG. 4B where selected power and ground pads are depopulated, in accordance with an embodiment.

Accordingly, embodiments disclosed herein provide a routing architecture that includes depopulated power and ground pads in the second layer L2 to make room for the routing of the $441_{1\text{-}2}$ channels. An example of such an embodiment is shown in FIG. 4C. FIG. 4C is a plan view illustration of the second metal layer L2 with a set of channels $441_{1\text{-}2}$ illustrated. Several of the power pads 454 and the ground pads 455 may be depopulated, as indicated by circles with an "x". For example, all of the power pads 454 and ground pads 455 in the $T_X2$ region are depopulated. Some, but not all, power pads 454 and ground pads 455 may also be depopulated in the $R_X2$ region and the $T_X1$ region. In an embodiment, an edge of the first bump map $450_1$ may be offset from an edge of the second bump map $450_2$ by a spacing O in order to simplify the routing. The routing of the channel $441_{2\text{-}1}$ in the fourth metal layer L4 may be done with minimal depopulation, since all of the $T_X1$ signals stop in the second metal layer L2.

Figure 5A:
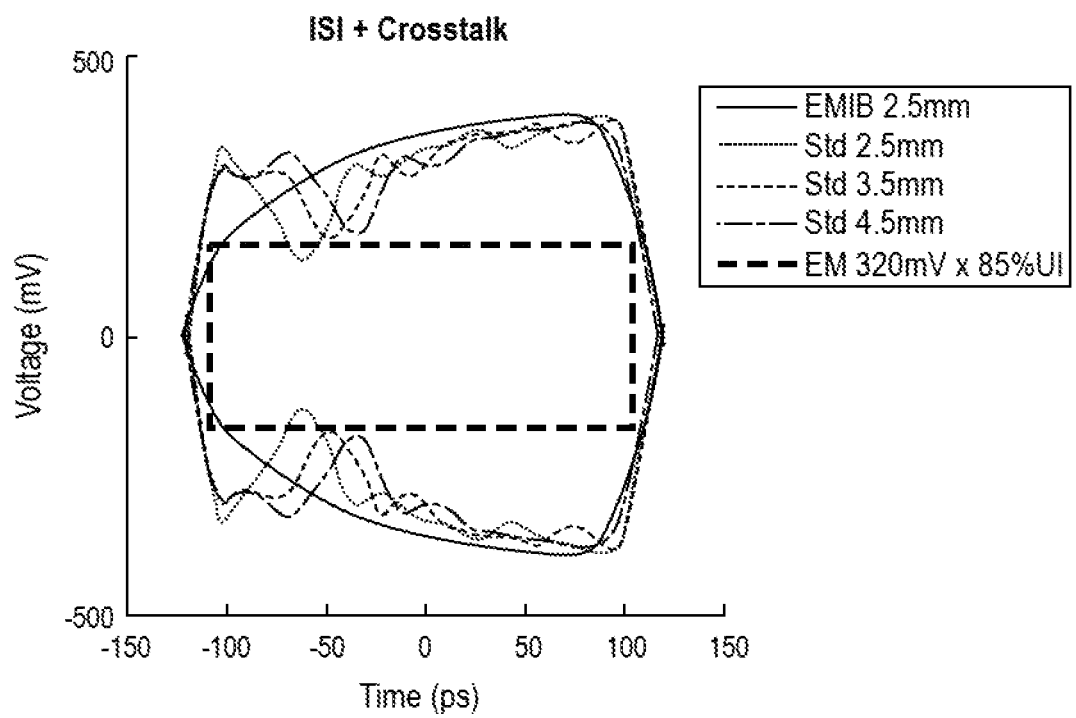
FIG. 5A is an eye diagram that illustrates the cross-talk that is present in standard package channels when using a PHYless architecture, in accordance with an embodiment.
Figure 5B:
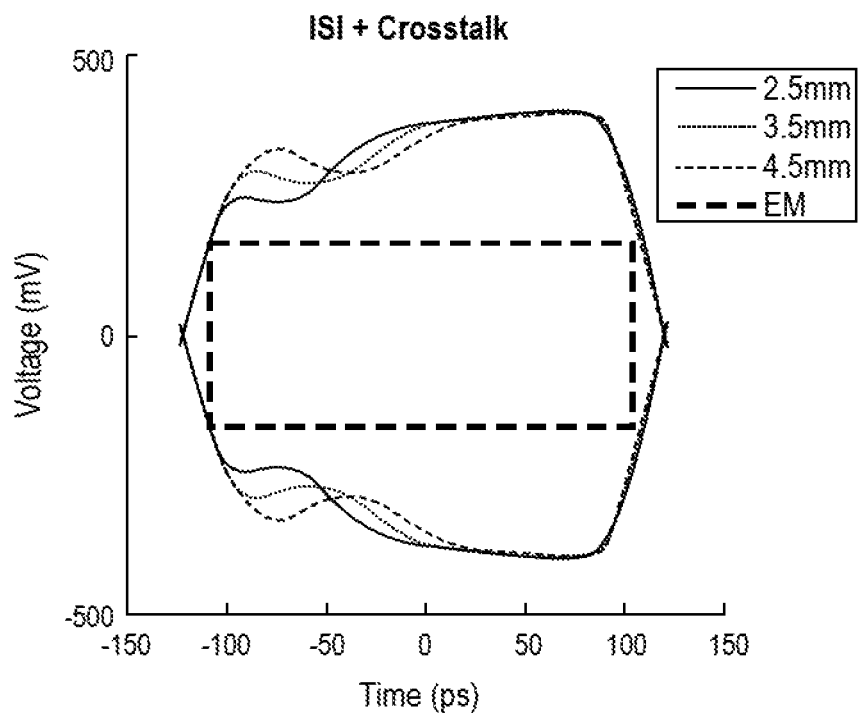
FIG. 5B is an eye diagram that illustrates the reduction in cross-talk that is provided when leadways are provided between the channel and the receiver circuit, in accordance with an embodiment.
Figure 5C:
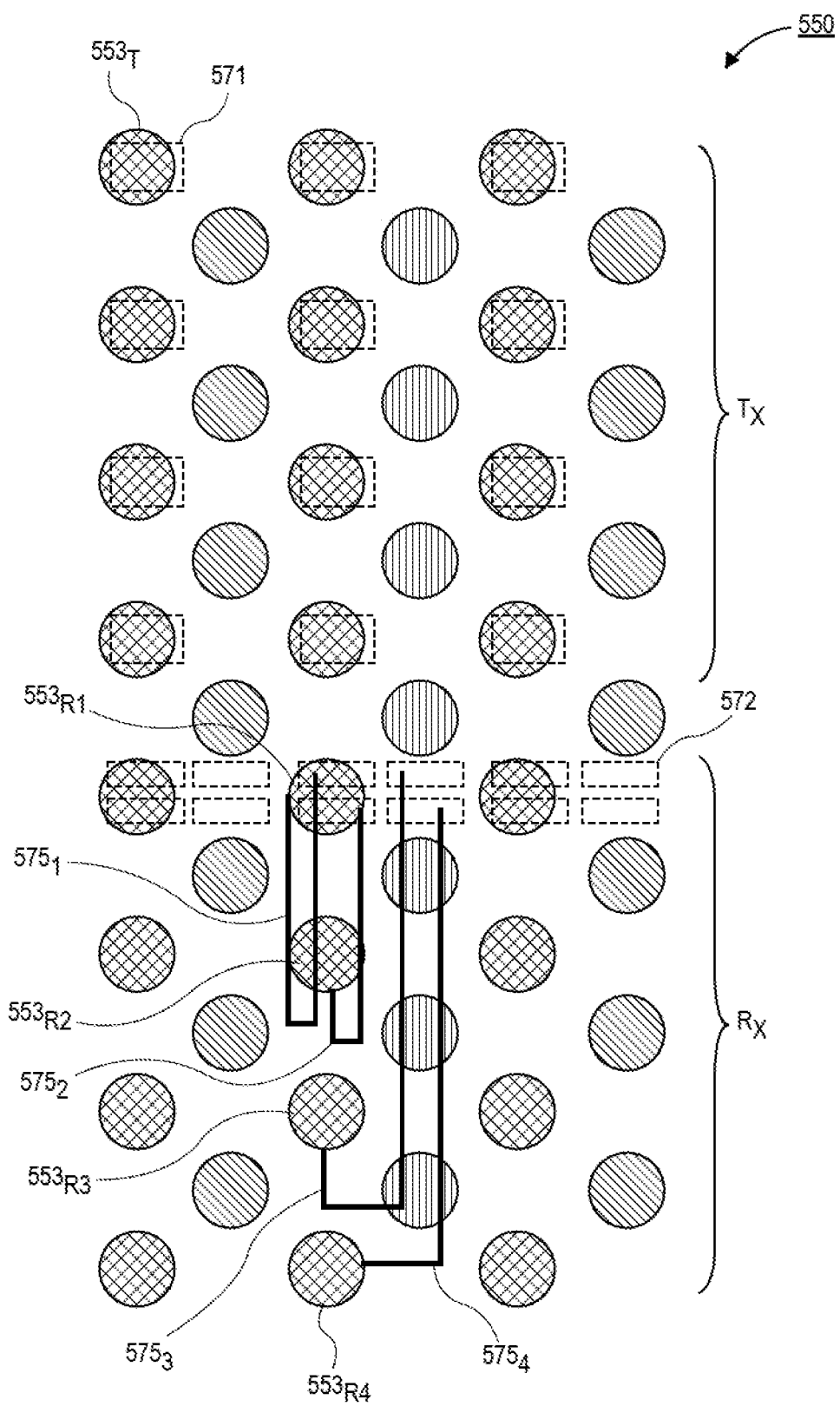
FIG. 5C is a plan view illustration of a bump map, where the transmitter circuits are located below transmitter bumps, and where the receiver circuits are connected to receiver bumps by a leadway, in accordance with an embodiment.

Referring now to FIGS. 5A-5C, a pair of eye diagrams and a plan view illustration depicting equalization routing (i.e., leadways) are provided, in accordance with an embodiment. In order to take full advantage of a PHYless design, the transmitter and receiver circuits need to be simple. However, there is a challenge for such circuits for both advanced package channels (e.g., channels over a bridge) and standard channels in a package substrate. As shown in the eye diagram of FIG. 5A, the bridge channel exhibits a strong RC behavior, but the standard package channels show strong reflections and amplified crosstalk. That is, it is challenging to use the same circuits for both types of channels, especially with the simple driver circuits of a PHYless design.

Accordingly, embodiments disclosed herein include the addition of on-die leadway routing on the $R_X$ modules to equalize the standard package trace. Additionally, on-die leadway routing is absent from the $T_X$ modules. As shown in FIG. 5B, the addition of leadway routing to the $R_X$ modules results in a much smoother eye diagram for standard package channels.

Referring now to FIG. 5C, a plan view illustration of a bump map 550 is shown, in accordance with an embodiment. The bump map 550 includes a $T_X$ region and an $R_X$ region. As shown, the $T_X$ bumps $553_T$ are located directly above the $T_X$ circuits 571. The $T_X$ circuits 571 are shown with a dashed outline to indicate that they are on the die surface below the $T_X$ bumps $553_T$. In contrast, the $R_X$ circuits 572 are not co-located with the $R_X$ bumps $553_R$. In an embodiment, the $R_X$ circuits 572 are arranged in an array along an edge of the $R_X$ region. Leadways 575 provide electrical coupling between the $R_X$ bumps $553_R$ and the $R_X$ circuits 572. For example, $R_X$ bump $553_{R1}$ is coupled to an $R_X$ circuit 572 by leadway $575_1$, $R_X$ bump $553_{R2}$ is coupled to an $R_X$ circuit 572 by leadway $575_2$, $R_X$ bump $553_{R3}$ is coupled to an $R_X$ circuit 572 by leadway $575_3$, and $R_X$ bump $553_{R4}$ is coupled to an $R_X$ circuit 572 by leadway $575_4$.

In an embodiment, the leadways 575 may be implemented in a back-end metal layer of a die. In a particular embodiment, the leadways 575 are implemented in the M14 or M15 layer of a die below the bumping layer. Embodiments may include leadways 575 that have any length in order to provide the needed equalization. In some embodiments, the leadways 575 may have a length that is between 200 μm and 600 μm. For example, a leadway 575 with a length of approximately 400 μm in the M15 layer may provide approximately 65 Ohm to the channel.

Additionally, the inclusion of leadways 575 provides a negligible impact on channels that are implemented over a bridge substrate. As such, the same circuitry can be utilized for both standard package substrate channels, and for advanced packaging architectures that utilize a bridge substrate.

Figure 6:
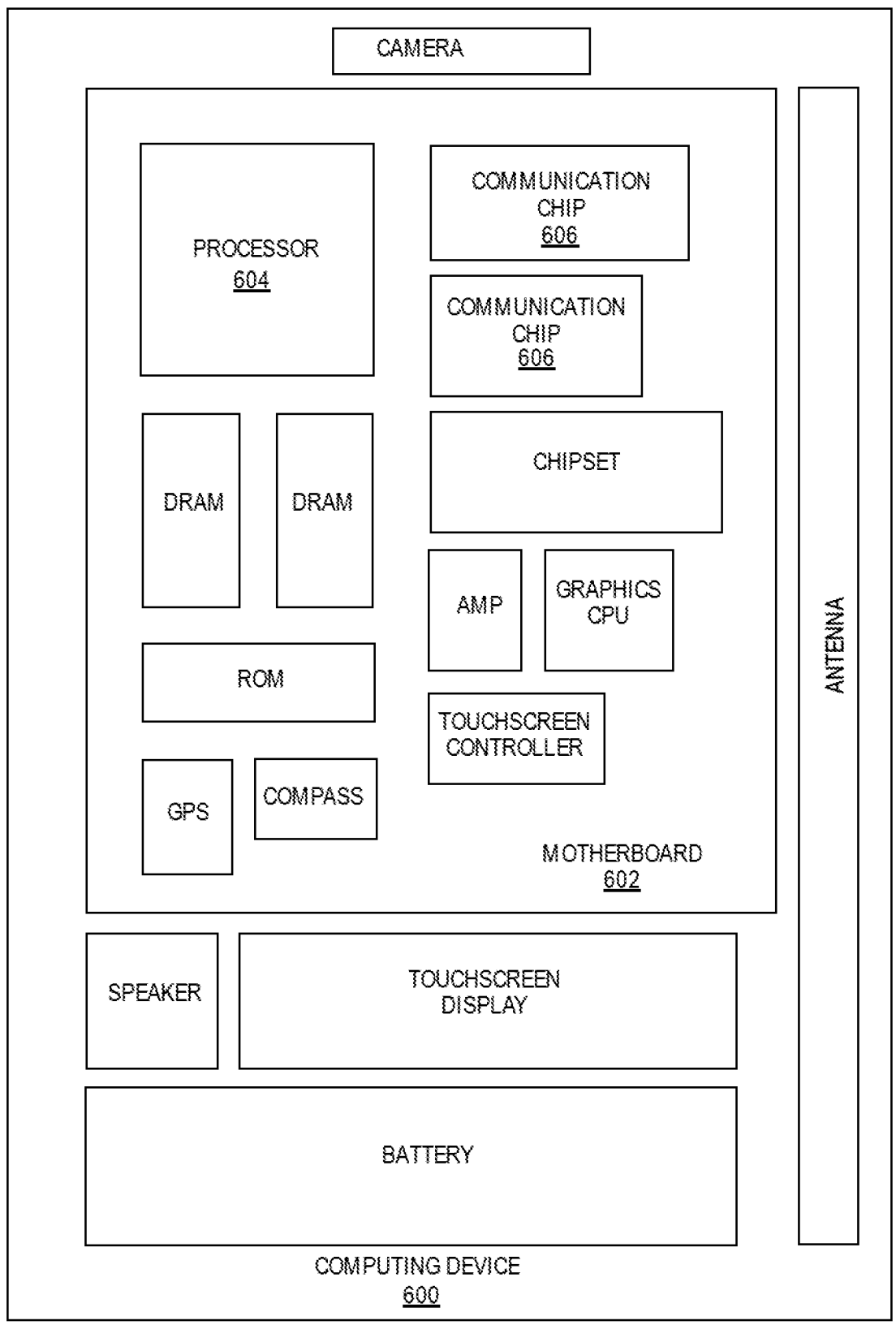
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be part of an electronic package that comprises a PHYless IO bump map, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be part of an electronic package that comprises a PHYless IO bump map, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a first die over the package substrate, wherein the first die comprises a first IO bump map, wherein bumps of the first IO bump map have a first pitch; a second die over the package substrate, wherein the second die comprises a second IO bump map, wherein bumps of the second IO bump map have a second pitch that is different than the first pitch; and interconnects between the first IO bump map and the second IO bump map.

Example 2: the electronic package of Example 1, wherein the first bump map has a first width along an edge of the first die, and wherein the second bump map has a second width along an edge of the second die, wherein the first width matches the second width.

Example 3: the electronic package of Example 1 or Example 2, wherein the first bump map has a first depth into the first die, and wherein the second bump map has a second depth into the second die, wherein the first depth is different than the second depth.

Example 4: the electronic package of Examples 1-3, wherein the interconnects are within the package substrate.

Example 5: the electronic package of Examples 1-3, further comprising: a bridge, wherein the interconnects are on the bridge.

Example 6: the electronic package of Examples 1-5, wherein the first pitch is approximately 55 μm or larger, and wherein the second pitch is approximately 55 μm or smaller.

Example 7: the electronic package of Examples 1-6, wherein the second pitch is approximately 45 μm, approximately 36 μm, or approximately 25 μm.

Example 8: the electronic package of Examples 1-7, wherein the first bump map has a first number of signal bumps, and wherein the second bump map has a second number of signal bumps, wherein the first number of signal bumps is equal to the second number of signal bumps.

Example 9: the electronic package of Example 8, wherein the first number of signal bumps is sixty.

Example 10: the electronic package of Examples 1-9, wherein the first bump map comprises: a first transmitter region; and a first receiver region, wherein the first transmitter region is along an edge of the first die; and wherein the second bump map comprises: a second transmitter region; and a second receiver region, wherein the second transmitter region is along an edge of the second die.

Example 11: an electronic package, comprising: a package substrate with a plurality of metal layers embedded in the package substrate, wherein a first metal layer, a third metal layer, and a fifth metal layer are power and/or ground layers, and wherein a second metal layer and a fourth metal layer are signaling layers; a first die over the package substrate, wherein the first die comprises: a first bump map with a first transmitter region and a first receiver region; a second die over the package substrate, wherein the second die comprises: a second bump map with a second transmitter region and a second receiver region; and wherein the first transmitter region is electrically coupled to the second receiver region by channels in the second metal layer, and wherein the second transmitter region is electrically coupled to the first receiver region by channels in the fourth metal layer.

Example 12: the electronic package of Example 11, wherein a set of power pads and a set of ground pads are depopulated from the second metal layer.

Example 13: the electronic package of Example 12, wherein the depopulated set of power pads and the depopulated ground pads comprise all of the power pads and all of the ground pads below the second transmitter region.

Example 14: the electronic package of Example 12, wherein none of the power pads and none of the ground pads are depopulated from the fourth metal layer.

Example 15: the electronic package of Examples 11-15, wherein an edge of the first bump map is offset from an edge of the second bump map.

Example 16: the electronic package of Example 15, wherein the first bump map has a first width along an edge of the first die, and wherein the second bump map has a second width along an edge of the second die, wherein the first width is equal to the second width.

Example 17: the electronic package of Examples 11-16, wherein the channels in the second metal layer and the channels in the fourth metal layer have the same length.

Example 18: a semiconductor die, comprising: a semiconductor substrate, wherein the semiconductor substrate comprises: an IO transmitter region comprising a plurality of transmitter circuits; and an IO receiver region comprising a plurality of receiver circuits; a plurality of metal layers over the semiconductor substrate; a plurality of first bumps over the IO transmitter region, wherein individual transmitter circuits are aligned with individual first bumps; and a plurality of second bumps over the IO receiver region, wherein individual receiver circuits are not aligned with individual second bumps.

Example 19: the semiconductor die of Example 18, wherein individual first bumps are electrically coupled to individual transmitter circuits by vertical interconnects through the plurality of metal layers, and wherein individual second bumps are electrically coupled to the individual receiver circuits by vertical interconnects and a horizontal leadway segment in the plurality of metal layers.

Example 20: the semiconductor die of Example 19, wherein the horizontal leadway segment has a length that is approximately 200 µm or greater.

Example 21: the semiconductor die of Examples 18-20, wherein the horizontal leadway adds approximately 65 Ohm to the electrical channel between the second bumps and the receiver circuit.

Example 22: the semiconductor die of Examples 18-21, wherein the plurality of receiver circuits are arranged in an array within the IO receiver region.

Example 23: an electronic system, comprising: a board; an electronic package coupled to the board; a first die over the package substrate, wherein the first die comprises a first IO bump map, wherein bumps of the first IO bump map have a first pitch; a second die over the package substrate, wherein the second die comprises a second IO bump map, wherein bumps of the second IO bump map have a second pitch that is different than the first pitch; and interconnects between the first IO bump map and the second IO bump map.

Example 24: the electronic system of Example 23, wherein the first bump map has a first width along an edge of the first die, and wherein the second bump map has a second width along an edge of the second die, wherein the first width matches the second width.

Example 25: the electronic package of Example 23 or Example 24, wherein the first bump map has a first depth into the first die, and wherein the second bump map has a second depth into the second die, wherein the first depth is different than the second depth.

What is claimed is:

1. An electronic package, comprising:
   a package substrate;
   a first die over the package substrate, wherein the first die comprises a first IO bump map, wherein bumps of the first IO bump map have a first pitch;
   a second die over the package substrate, wherein the second die comprises a second IO bump map, wherein bumps of the second IO bump map have a second pitch that is different than the first pitch;
   interconnects between the first IO bump map and the second IO bump map, wherein the interconnects communicatively couple the first IO bump map to the second IO bump map; and
   a bridge die embedded in the package substrate, wherein the interconnects are on the bridge die, the bridge die comprising a first metal layer above a second metal layer, wherein both the first metal layer and the second layer are coupled to the interconnects to communicatively couple the first IO bump map to the second IO bump map, wherein the first metal layer couples an outermost interconnect of the first die to a second outermost interconnect of the second die, and wherein the second metal layer couples an outermost interconnect of the second die to a second outermost interconnect of the first die.

2. The electronic package of claim 1, wherein the first bump map has a first width along an edge of the first die, and wherein the second bump map has a second width along an edge of the second die, wherein the first width matches the second width.

3. The electronic package of claim 1, wherein the first bump map has a first depth into the first die, and wherein the second bump map has a second depth into the second die, wherein the first depth is different than the second depth.

4. The electronic package of claim 1, wherein the interconnects are within the package substrate.

5. The electronic package of claim 1, wherein the first pitch is approximately 55 µm or larger, and wherein the second pitch is approximately 55 µm or smaller.

6. The electronic package of claim 1, wherein the second pitch is approximately 45 µm, approximately 36 µm, or approximately 25 µm.

7. The electronic package of claim 1, wherein the first bump map has a first number of signal bumps, and wherein the second bump map has a second number of signal bumps, wherein the first number of signal bumps is equal to the second number of signal bumps.

8. The electronic package of claim 7, wherein the first number of signal bumps is sixty.

9. The electronic package of claim 1, wherein the first bump map comprises:
   a first transmitter region; and
   a first receiver region, wherein the first transmitter region is along an edge of the first die; and
   wherein the second bump map comprises:
   a second transmitter region; and
   a second receiver region, wherein the second transmitter region is along an edge of the second die.

10. An electronic package, comprising:
    a package substrate with a plurality of metal layers embedded in the package substrate, wherein a first metal layer, a third metal layer, and a fifth metal layer are power and/or ground layers, and wherein a second metal layer and a fourth metal layer are signaling layers;
    a first die over the package substrate, wherein the first die comprises:
    a first bump map with a first transmitter region and a first receiver region;
    a second die over the package substrate, wherein the second die comprises:
    a second bump map with a second transmitter region and a second receiver region; and
    wherein the first transmitter region is electrically coupled to the second receiver region by channels in the second metal layer, and wherein the second transmitter region is electrically coupled to the first receiver region by channels in the fourth metal layer.

11. The electronic package of claim 10, wherein a set of power pads and a set of ground pads are depopulated from the second metal layer.

12. The electronic package of claim 11, wherein the depopulated set of power pads and the depopulated ground pads comprise all of the power pads and all of the ground pads below the second transmitter region.

13. The electronic package of claim 11, wherein none of the power pads and none of the ground pads are depopulated from the fourth metal layer.

14. The electronic package of claim 10, wherein an edge of the first bump map is offset from an edge of the second bump map.

15. The electronic package of claim 14, wherein the first bump map has a first width along an edge of the first die, and wherein the second bump map has a second width along an edge of the second die, wherein the first width is equal to the second width.

16. The electronic package of claim 10, wherein the channels in the second metal layer and the channels in the fourth metal layer have the same length.

17. A semiconductor die, comprising:
a semiconductor substrate, wherein the semiconductor substrate comprises:
an IO transmitter region comprising a plurality of transmitter circuits; and
an IO receiver region comprising a plurality of receiver circuits;
a plurality of metal layers over the semiconductor substrate;
a plurality of first bumps over the IO transmitter region, wherein individual transmitter circuits are aligned with individual first bumps; and
a plurality of second bumps over the IO receiver region, wherein individual receiver circuits are not aligned with individual second bumps.

18. The semiconductor die of claim 17, wherein individual first bumps are electrically coupled to individual transmitter circuits by vertical interconnects through the plurality of metal layers, and wherein individual second bumps are electrically coupled to the individual receiver circuits by vertical interconnects and a horizontal leadway segment in the plurality of metal layers.

19. The semiconductor die of claim 18, wherein the horizontal leadway segment has a length that is approximately 200 μm or greater.

20. The semiconductor die of claim 18, wherein the horizontal leadway adds approximately 65 Ohm to the electrical channel between the second bumps and the receiver circuit.

21. The semiconductor die of claim 17, wherein the plurality of receiver circuits are arranged in an array within the IO receiver region.

22. An electronic system, comprising:
a board;
a package substrate coupled to the board;
a first die over the package substrate, wherein the first die comprises a first IO bump map, wherein bumps of the first IO bump map have a first pitch;
a second die over the package substrate, wherein the second die comprises a second IO bump map, wherein bumps of the second IO bump map have a second pitch that is different than the first pitch;
interconnects between the first IO bump map and the second IO bump map, wherein the interconnects communicatively couple the first IO bump map to the second IO bump map; and
a bridge die embedded in the package substrate, wherein the interconnects are on the bridge die, the bridge die comprising a first metal layer above a second metal layer, wherein both the first metal layer and the second layer are coupled to the interconnects to communicatively couple the first IO bump map to the second IO bump map, wherein the first metal layer couples an outermost interconnect of the first die to a second outermost interconnect of the second die, and wherein the second metal layer couples an outermost interconnect of the second die to a second outermost interconnect of the first die.

23. The electronic system of claim 22, wherein the first bump map has a first width along an edge of the first die, and wherein the second bump map has a second width along an edge of the second die, wherein the first width matches the second width.

24. The electronic package of claim 22, wherein the first bump map has a first depth into the first die, and wherein the second bump map has a second depth into the second die, wherein the first depth is different than the second depth.

25. An electronic package, comprising:
a package substrate;
a first die over the package substrate, wherein the first die comprises a first IO bump map, wherein bumps of the first IO bump map have a first pitch;
a second die over the package substrate, wherein the second die comprises a second IO bump map, wherein bumps of the second IO bump map have a second pitch that is different than the first pitch, wherein the first bump map has a first number of signal bumps, and wherein the second bump map has a second number of signal bumps, wherein the first number of signal bumps is equal to the second number of signal bumps; and
interconnects between the first IO bump map and the second IO bump map.

26. An electronic package, comprising:
a package substrate;
a first die over the package substrate, wherein the first die comprises a first IO bump map, wherein bumps of the first IO bump map have a first pitch;
a second die over the package substrate, wherein the second die comprises a second IO bump map, wherein bumps of the second IO bump map have a second pitch that is different than the first pitch;
interconnects between the first IO bump map and the second IO bump map, wherein the interconnects communicatively couple the first IO bump map to the second IO bump map; and
a bridge die embedded in the package substrate, wherein the interconnects are on the bridge die, the bridge die comprising a first metal layer above a second metal layer, wherein both the first metal layer and the second layer are coupled to the interconnects to communicatively couple the first IO bump map to the second IO bump map, wherein the first bump map has a first number of signal bumps, and wherein the second bump map has a second number of signal bumps, wherein the first number of signal bumps is equal to the second number of signal bumps.

27. The electronic package of claim 26, wherein the first number of signal bumps is sixty.

* * * * *